United States Patent [19]

Suzuki et al.

[11] Patent Number: 5,469,012
[45] Date of Patent: Nov. 21, 1995

[54] ELECTRONIC COMPONENT

[75] Inventors: Yoshihisa Suzuki; Yuuichi Sugawara; Susumu Ishihara; Ikuo Katoh, all of Tokyo, Japan

[73] Assignee: TDK Corporation, Tokyo, Japan

[21] Appl. No.: 374,528

[22] PCT Filed: Jul. 5, 1993

[86] PCT No.: PCT/JP93/00923

§ 371 Date: Feb. 1, 1995

§ 102(e) Date: Feb. 1, 1995

[87] PCT Pub. No.: WO94/05134

PCT Pub. Date: Mar. 3, 1994

[30] Foreign Application Priority Data

Aug. 26, 1992 [JP] Japan ................. 4-250722

[51] Int. Cl.⁶ ................................................ H01L 41/08
[52] U.S. Cl. ............................................. 310/348; 310/324
[58] Field of Search ........................... 310/324, 330–332, 310/334–337, 348, 363, 365

[56] References Cited

U.S. PATENT DOCUMENTS

| | | | |
|---|---|---|---|
| 3,823,318 | 7/1974 | Krauce | 250/214 P |
| 4,519,692 | 5/1985 | Michelih | 354/412 |
| 5,171,965 | 12/1992 | Suzuki et al. | 219/121.6 |
| 5,191,374 | 3/1993 | Hazamu et al. | 355/53 X |
| 5,250,797 | 10/1993 | Sano et al. | 355/68 X |
| 5,329,202 | 7/1994 | Garlick et al. | 310/334 |
| 5,376,857 | 10/1994 | Takeuchi et al. | 310/328 X |

FOREIGN PATENT DOCUMENTS 58-29680 6/1983 Japan.
63-89280 6/1988 Japan.

*Primary Examiner*—Mark O. Budd
*Attorney, Agent, or Firm*—Oblon, Spivak, McClelland, Maier & Neustadt

[57] ABSTRACT

An electronic elemental A1 has a lead electrode at the edge and a supporting member A2, positioned so that it faces the electronic element across a gap G. The supporting member A2 also has an external connecting terminal A5 at a location opposite the lead electrode A4. A resin layer A3 is positioned between electronic element A1 and supporting member A2, indented by the distance d from the edge of the electronic element A1. The resin layer bonds the electronic element (A1) and supporting member A2. The relationship of the distance d with G should satisfy this expression; d>G. A solder A6 fills the space created by the gap G between the lead electrode A4 and the external connecting terminal A5 over the distance d which is the distance from the edge of the electronic component A1, to the resin layer A3. The solder connects the lead electrode A4 and the external connecting terminal A5. No defective connection occurs between the lead electrode and the external connecting terminal when the electronic component is mounted on the printed board.

7 Claims, 7 Drawing Sheets

ELECTRONIC COMPONENT

TECHNICAL FIELD

The present invention relates to electronic components such as piezoelectric parts and the like.

BACKGROUND ART

The best known electronic component of this type to date comprises an electronic element, a supporting member, a resin layer and a solder. As shown in FIG. 11, the electronic element B1 has a lead electrode B4 at the edge, and the supporting member B2 is positioned opposite the electronic element B1 across a gap G. The supporting member B2 has an external connecting terminal B5 which extends from the front surface to the bottom surface of the supporting member B2 at a location that faces the lead electrode B4 across the notch. The resin layer B3 is positioned between the electronic element B1 and the supporting member B2 and bonds the electronic element B1 to the supporting member B2. The solder B6 fills the space at the notch and connects the lead electrode B4 with the external connecting terminal B5.

However, as shown in FIG. 12, the electronic component of the prior art has a problem in that when it is mounted on a printed board P, the solder B6 which connects the lead electrode B4, which is formed adjacent to the electronic element B1, with the external connecting terminal B5, which is formed adjacent to the supporting member B2, tends to remelt and become absorbed into the solder S applied to the printed board P, resulting in a defective connection between the lead electrode B4 and the external connecting terminal B5.

DISCLOSURE OF INVENTION

It is an object of the present invention to provide an electronic component of which defective connections including disconnections due to solder bridging are prevented.

Another object of the present invention is to provide an electronic component which can be directly mounted on a circuit board by soldering the external connecting terminal to the conductors formed on the circuit board, A further object of the present invention is to provide an electronic component of which the filling solder, which connects the lead electrode with the external connecting terminal, does not remelt and thus precludes to become absorbed into the paste solder applied to the circuit board when the electronic component is mounted thereon.

A still further object of the present invention is to provide an electronic component of which the electronic element is not likely to be subject to the effect of soldering heat, and in which it is possible to prevent degradation of the electronic element characteristics, caused by solder adhering to the element.

A still further object of the present invention is to provide an electronic component of which chipping and other damage caused during transportation and while mounting can be prevented, and one of which it is not likely that adhesion loss will occur, even in the case of an external thermal shock or the like.

In order to achieve the above objects, the electronic component of the present invention comprises an electronic element, a supporting member, a resin layer and a solder. The electronic element has a lead electrode at the edge. The supporting member is positioned at a location that faces the electronic element across a gap G. The supporting member has an external connecting terminal at a location that faces the afore-mentioned lead electrode. The resin layer is positioned between the electronic element and the supporting member, indented by a distance d from the edge of the electronic element and bonds the electronic element and the supporting member. The distance d satisfies the following relationship with the gap G; d>G . The solder fills the space formed by the gap G over the distance d and connects the lead electrode and the external connecting terminal.

Due to the afore-mentioned arrangement, i.e., that the supporting member is positioned at a location that faces the electronic element across the gap G; that the resin layer is positioned between the electronic element and the supporting member, indented by the distance d from the edge of the electronic element; that the relationship of the distance d with the gap G is expressed as: d>G, and that the solder fills the space formed by the gap G over the distance d and connects the lead electrode with the external connecting terminal, the solder does not remelt to become absorbed into the paste solder applied to the printed board when the electronic component is mounted thereon. Therefore, defective connections between the lead electrode and the external connecting terminal will not occur. Also, as the relationship of the distance d with the gap G is expressed as: d>G, solder bridging, which occurs when the distance d becomes equal to, or smaller than the gap G, will not occur. Consequently, disconnections in solder bridging, which are a result of the surface tension of melted solder, will not occur, even when the electronic component is subject to high temperature such as in reflow soldering.

Since the supporting member has an external connecting terminal and the filling solder connects the lead electrode with the external connecting terminal, it becomes possible to mount the electronic element directly on the circuit board via the supporting member. This may be accomplished by soldering the external connecting terminal to the electronic element on the printed board. Also, during soldering, the electronic element is less likely to be subject to the effect of the soldering heat. Degradation of the electronic element characteristics, caused by solder adhering to the element, can also be prevented.

Since the resin layer bonds the electronic element and the supporting member, the mechanical strength of the electronic component is increased. Because of this, chipping and other damage caused to the electronic component during transportation and while mounting are prevented. Also, the electronic element is less likely to lose adhesion to the resin layer even in the case of an external thermal shock or the like.

BRIEF DESCRIPTION OF DRAWINGS

A more complete appreciation of the invention and many of the attendant advantages thereof become better understood when refering to the following detailed description of the accompanied drawings, wherein.

BEST MODE FOR CARRYING OUT THE INVENTION

Figure 1:
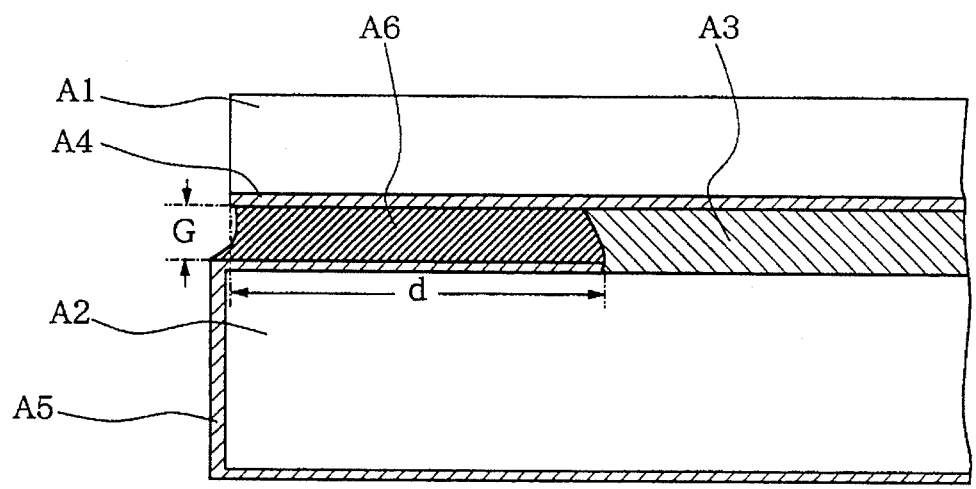
FIG. 1 is a cross sectional side view of the electronic component of the present invention.

FIG. 1 shows the electronic component of the present invention comprising an electronic element A1, a supporting member A2, a resin layer A3, a lead electrode A4, an external connecting terminal A5 and a solder A6.

The electronic element A1 has the lead electrode A4 at the edge. The supporting member A2 is positioned at a location that is opposite the electronic element A1 across a gap G and has an external connecting terminal A5 at a location that faces the lead electrode A4. The resin layer A3 is positioned between the electronic element A1 and the supporting member A2, indented by the distance d from the edge of the electronic element A1. This layer bonds the electronic element A1 and the supporting member A2. The relationship of the distance d with the gap G is expressed as: d>G. The upper limit for the distance d is determined by the size of the component. For example, with piezoelectric components and the like, it should be 10 G or less.

The solder A6 fills the space which is formed by the gap G over the distance d and connects the lead electrode A4 and the external connecting terminal AS.

Figure 2:
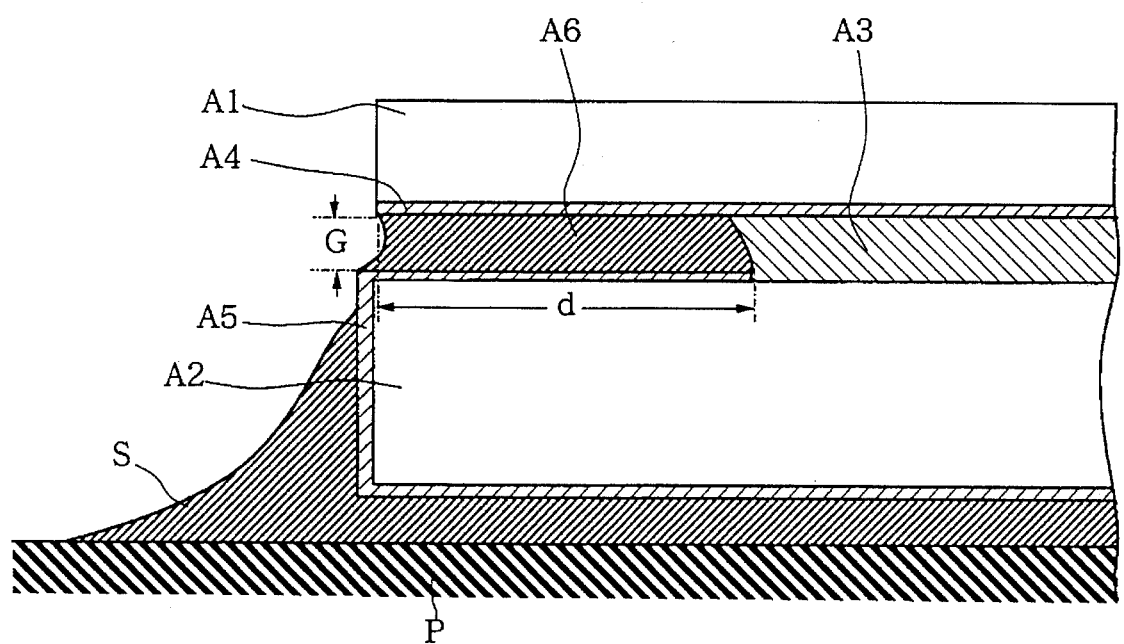
FIG. 2 is a cross sectional side view showing the condition of the solder when the electronic component of the present invention is mounted on the printed board.

Due to the afore-mentioned structure, i.e., that the supporting member A2 is positioned at a location that is opposite the electronic element A1 across the gap G; that the resin layer A3 is positioned between the electronic element A1 and the supporting member A2, indented by the distance d from the edge of the electronic element A1; that the distance d and the gap G satisfy the relationship; d>G; and that the solder A6 fills the space which is formed by the gap G over the distance d and connects the lead electrode A4 with tile external connecting terminal AS, the solder A6 does not remelt to become absorbed into the paste solder applied to the printed board when the electronic component is mounted thereon, as lo illustrated in FIG. 2. Consequently, defective connections between the lead electrode A4 and the external connecting terminal A5 do not occur.

Figure 3:
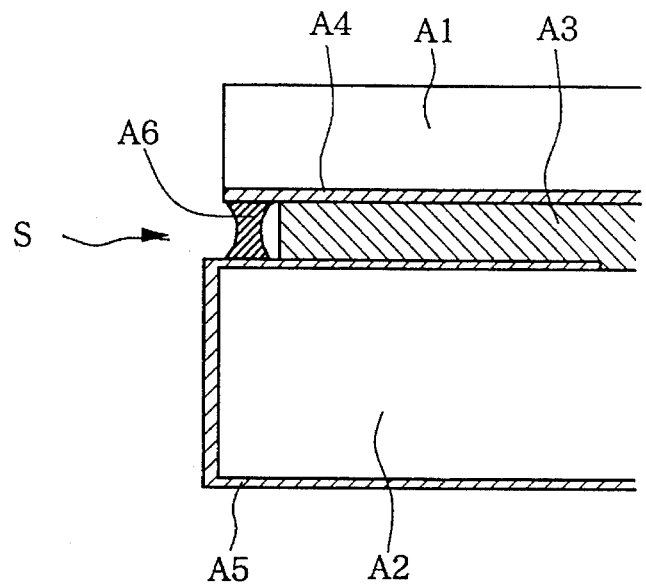
FIG. 3 is a cross sectional side view showing the condition of solder bridging with the solder.

Also, as the relationship of the distance d with the gap G is expressed as: d>G, solder bridging, which occurs when the distance d becomes equal to or smaller than the gap G, does not occur. If G a d, solder bridging S occurs as illustrated in FIG. 3.

Figure 4:
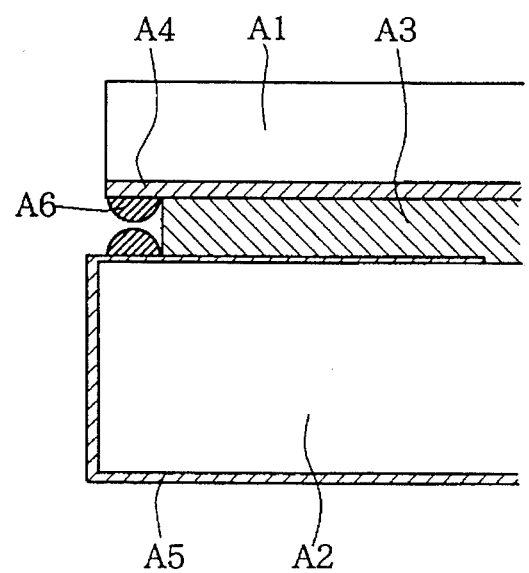
FIG. 4 is a cross sectional side view showing the condition in which the solder bridge is disconnected.
Figure 5:
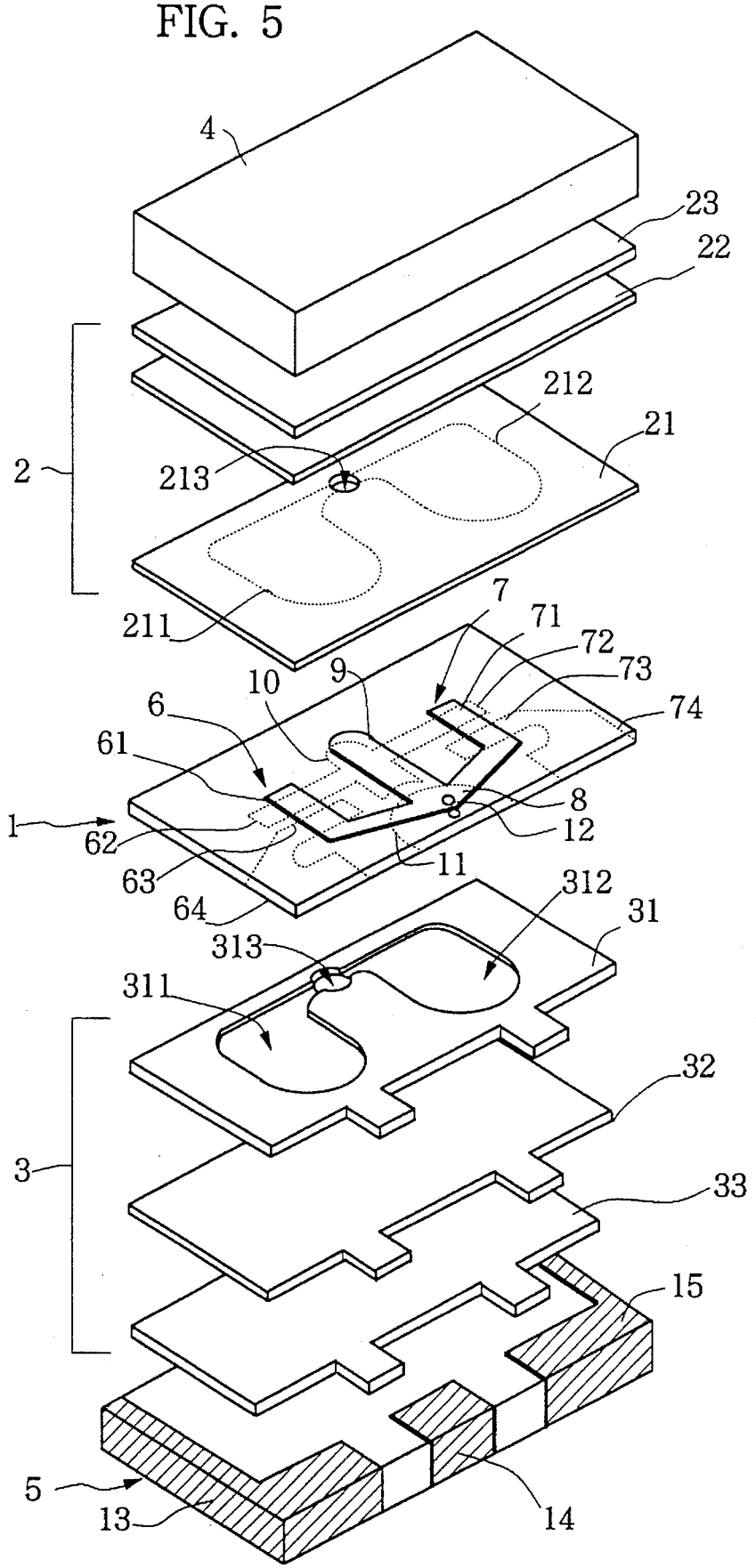
FIG. 5 is an exploded perspective view showing the piezoelectric component of the present invention.
Figure 6:
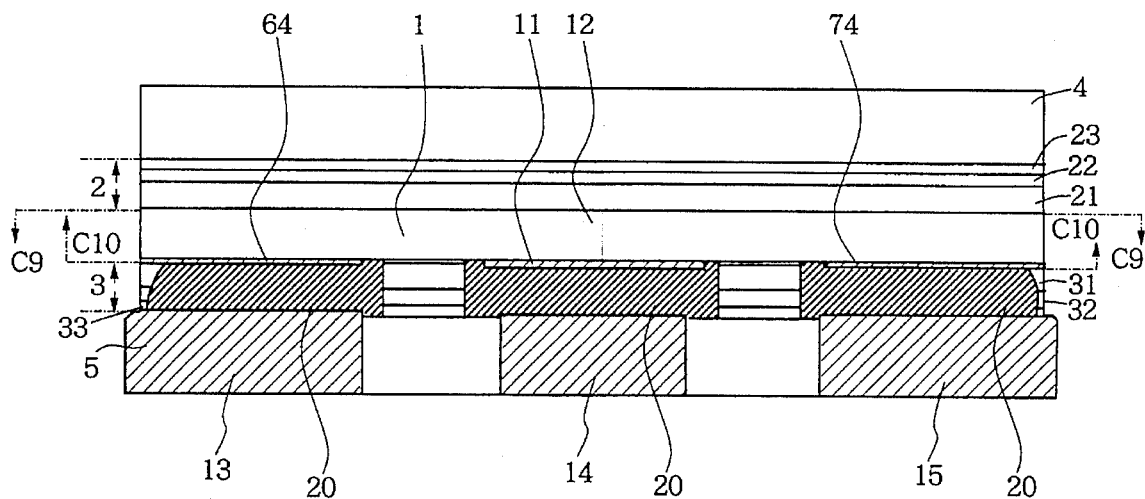
FIG. 6 is a front view of the piezoelectric component of the present invention.
Figure 7:
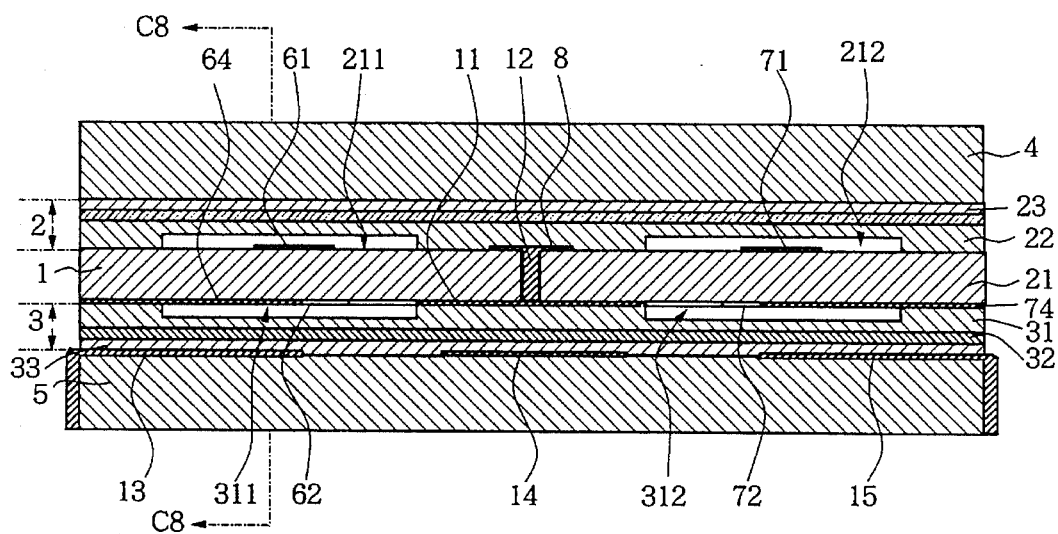
FIG. 7 is a cross sectional front view showing the piezoelectric component of the present invention.
Figure 8:
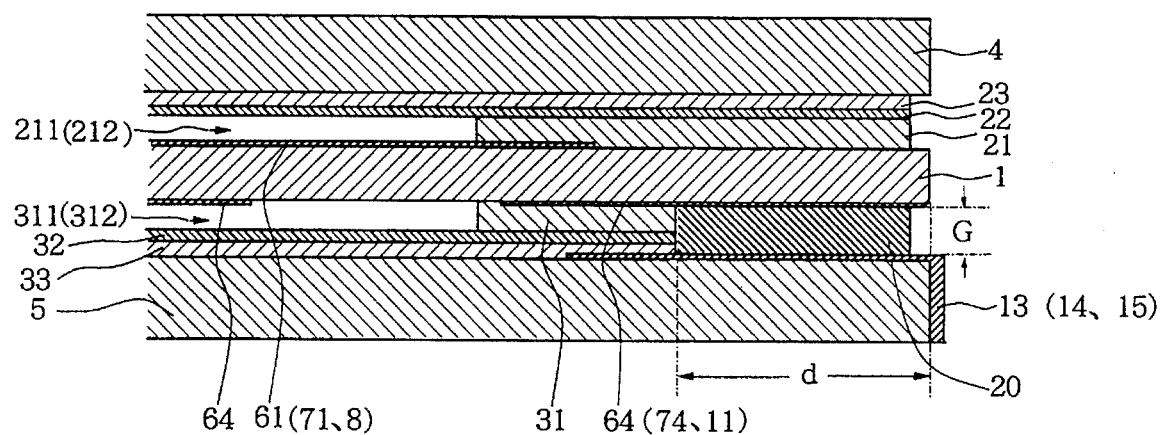
FIG. 8 is a cross sectional view of FIG. 7 taken along line C8—C8.
Figure 9:
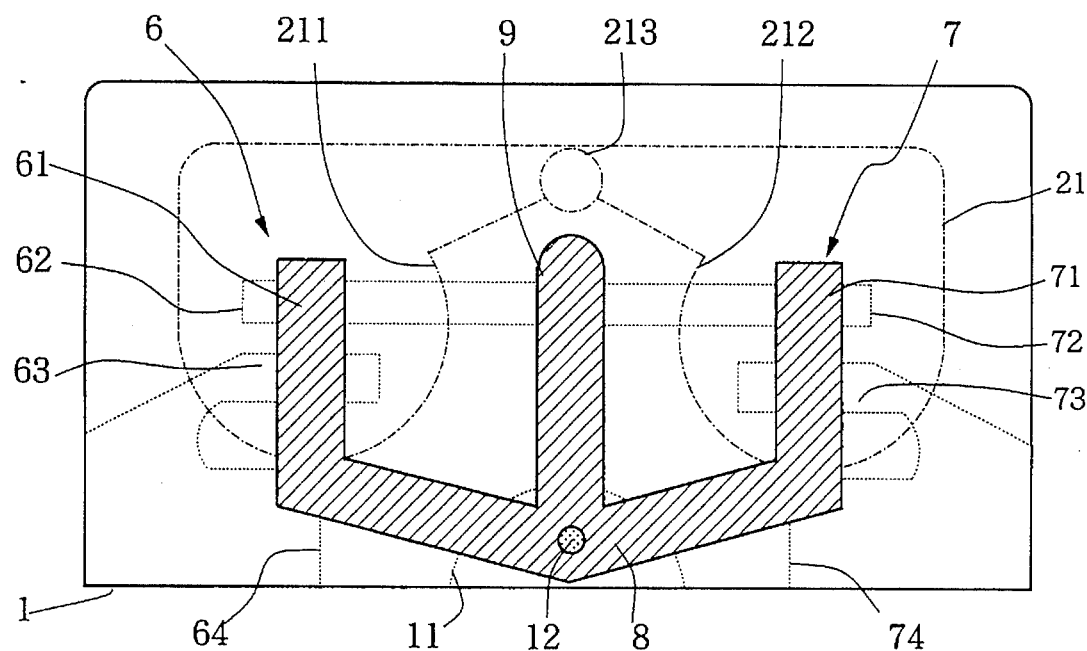
FIG. 9 is a cross sectional view of FIG. 6 taken along line C9—C9.
Figure 10:
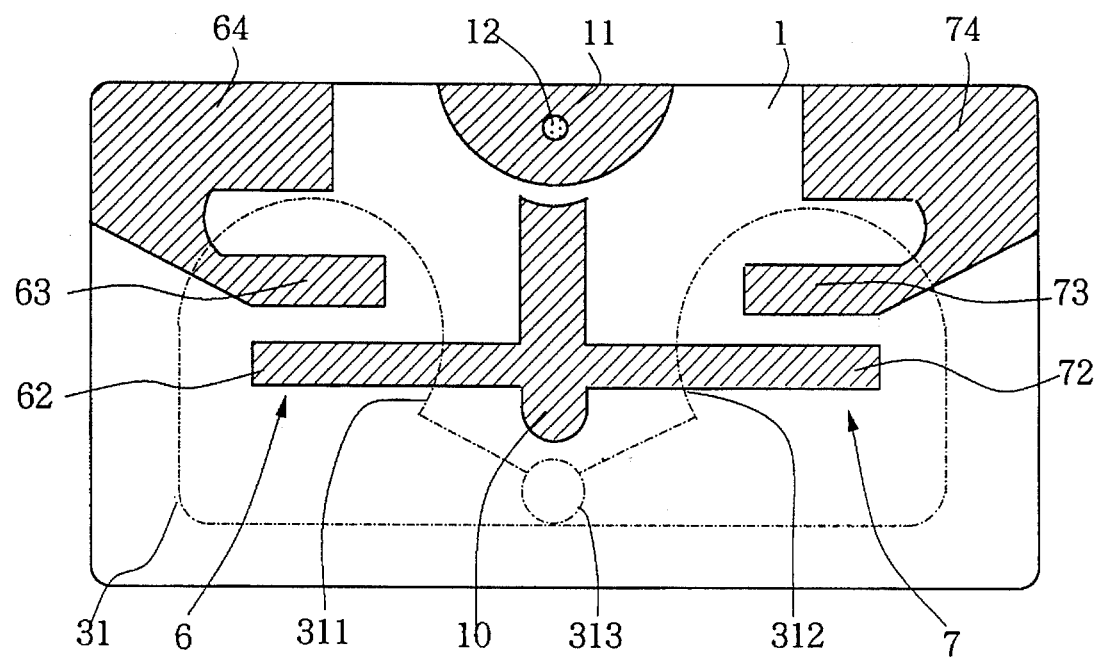
FIG. 10 is a cross sectional view of FIG. 6 taken along line C10—C10.
Figure 11:
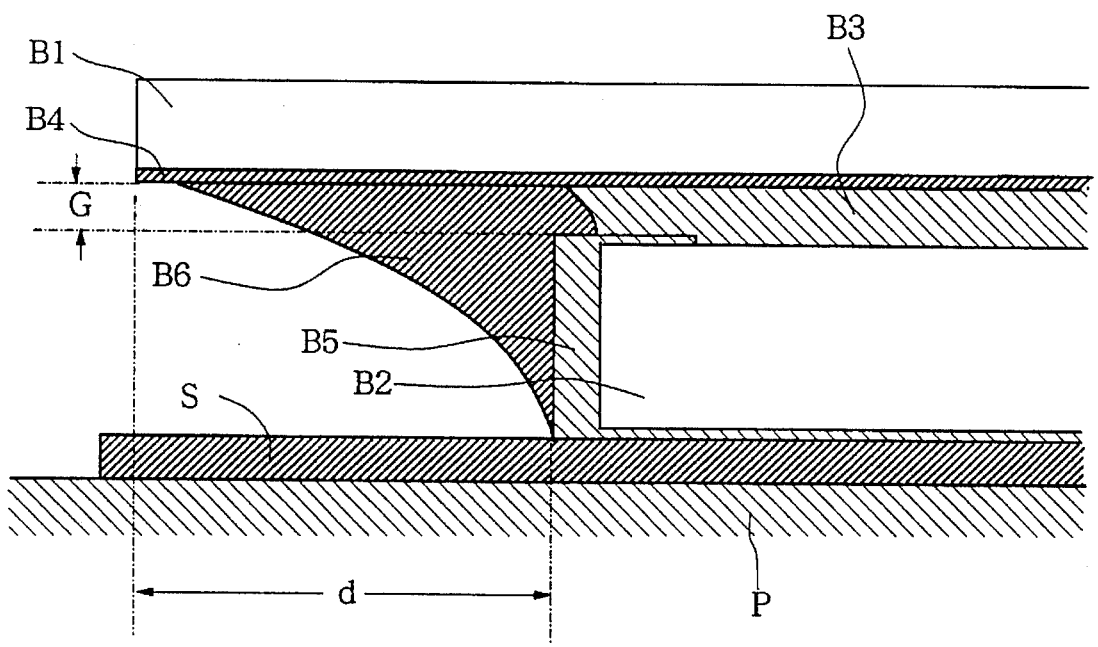
FIG. 11 is a cross sectional side view of a conventional electronic component.
Figure 12:
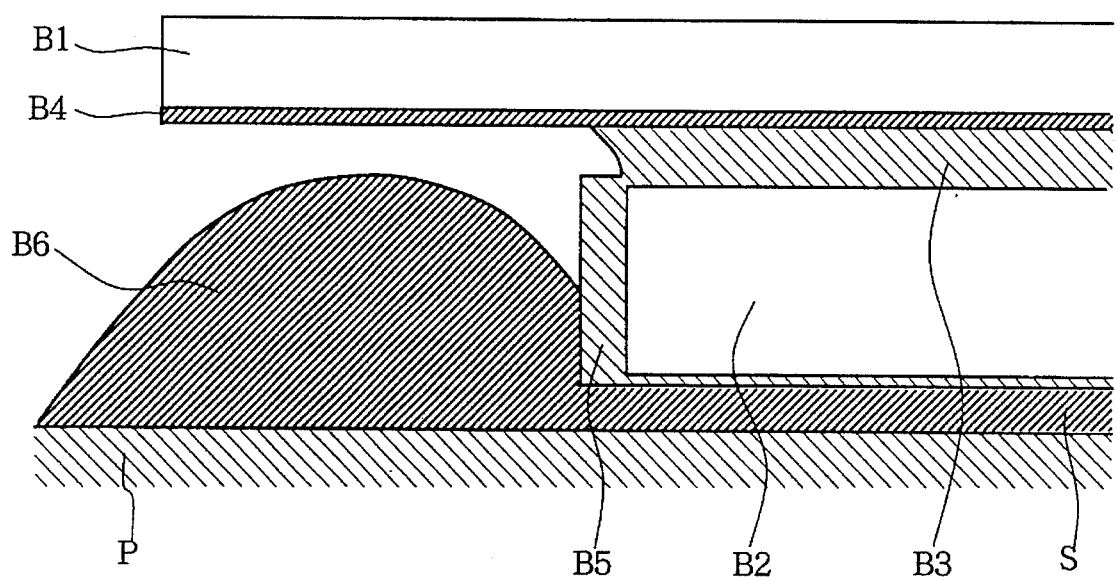
FIG. 12 is a view showing the condition of solder when the conventional electronic component is mounted on the printed board.

Also, disconnection of solder bridging caused by the surface tension of the melted solder does not occur, even when the electronic component is subject to a high temperature such as in reflow soldering. If G is ≧d, the solder bridging P will melt and a disconnection of the bridge will occur due to the surface tension of the solder as illustrated in FIG. 4.

Since the supporting member A2 has an external connecting terminal AS, and the solder A6 connects the lead electrode A4 and the external connecting terminal A5, it becomes possible to mount an electronic element A1 directly on the printed board. Also, while soldering, the electronic element A1 is less likely to be subject to the effect of soldering heat. Degradation of the characteristics of the electronic element A1 caused by adhered solder can also be prevented by this structure.

Also, since the resin layer A3 bonds the electronic element A1 and the supporting member A2, the mechanical strength of the electronic component is increased. Because of this, chipping and other damage caused to the electronic element during transportation and while mounting are prevented. At the same time, the electronic element is less likely to lose adhesion to the resin layer, even when there is a thermal shock or the like from the outside.

Next, an actual example of a piezoelectric component in an application of the present invention is explained by referring to FIGS. 5 through 10. The piezoelectric component in the drawings includes a piezoelectric substrate 1, a first resin layer 2, a second resin layer 3, a front supporting member 4, a bottom supporting member 5 and a solder 20.

The piezoelectric substrate 1 has resonators 6 and 7. Each of the resonators has front electrodes 61 and 71 and bottom electrodes 62 and 63, and 72 and 73 that are structured in such a way that they face each other on the front and bottom sides of the piezoelectric substrate 1. The front electrodes 61 and 71 are commonly connected to the first lead electrode 8. The first lead electrode also has a continuous capacitor electrode 9 that is formed on both sides of the piezoelectric substrate 1.

The bottom electrodes 62 and 72 are continuously connected with each other via a capacitor electrode 10 that is positioned opposite the capacitor electrode 9, and the bottom electrodes 63 and 73 are conducted to the edges in both corners of the piezoelectric substrate 1 by the second lead electrodes 64 and 74 that are formed on the piezoelectric substrate 1. In regard to the arrangement of the electrodes, it is possible to have another arrangement in which electrodes 62 and 63, and 72 and 73 are the front electrodes and electrodes 61 and 71 are the bottom electrodes as opposed to the arrangement shown in the drawings.

The first lead electrode 11 is mounted on the bottom side of the piezoelectric substrate 1 opposite the first lead electrode 8 on the front side. The first lead electrode 8 which is mounted on the front side of the piezoelectric substrate, and the first lead electrode 11 which is mounted on the bottom side of the piezoelectric substrate are connected by a conductor 12 that runs between front and bottom through the piezoelectric substrate 1. The conductor 12 can take any form and can be mounted at any location as long as it is in a position where it does not affect the desired mode of vibration, and in a location where the first lead electrodes 8 and 11 can be interconnected. The conductor 12 shown in the drawing can be created by attaching conductive material inside a through hole created in the piezoelectric substrate, together with the first lead electrodes 8 and 11 and the second lead electrodes 64 and 74 which are created by means of a thin film technology such as sputtering or a thick film technology such as printing. The through hole can be created by green sheet punching before sintering, or a laser beam machining after sintering. The front electrodes, 61 and 71, and the bottom electrodes 62 and 63, and 72 and 73 can also be created by using a thin film technology such as sputtering or by using a thick film technology such as printing. The first resin layer 2 includes a hollow layer 21, a sealing layer 22 and a bonding layer 23. Likewise, the second resin layer 3 includes a hollow layer 31, a sealing layer 32 and a bonding layer 33. The hollow layers 21 and 31 have hollow sections 211 and 212, and 311 and 312 at locations that correspond with resonators 6 and 7 and are in contact with the piezoelectric substrate 1. The hollow sections 211 and 212, and 311 and 312 have openings 213 and 313 which leave space for the front electrodes 61 and 71 and the bottom electrodes 62 and 63, and 72, 73 of the resonators 6 and 7. The hollow sections 211 and 212, and 311 and 312 are formed in such a manner that they surround the resonators that are composed of front electrodes 61 and 71 and bottom electrodes 62 and 63, and 72 and 73, and there is a path between them via openings 213 and 313. The sealing layers 22 and 32, which are made of an insulating resin, are adhered to the hollow layers 21 and 31 and seal openings 213 and 313. It is desirable to prepare sealing layers 22 and 32 with ultraviolet hardening resin.

The front supporting member 4 is made of a ceramic material such as alumina or the like and is bonded on top of the sealing layer 22 by the bonding layer 23.

The bottom supporting member 5 is composed of a ceramic material such as alumina or the like and is bonded to the surface of the sealing layer 32 that makes up the second resin layer 3 by the bonding layer 33. External connecting terminals 13, 14 and 15 are formed at positions opposite the first lead electrodes 8 and 11 and the second lead electrodes 64 and 74 at one edge of the bottom supporting member 5. The external connecting terminals 13, 14 and 15 are formed by employing thick film technology or plating technology or by combining the two.

The second resin layer 3 is positioned between the piezoelectric substrate 1 and the bottom supporting member 5 indented by the distance d from the edge of the piezoelectric substrate 1, and bonds the piezoelectric substrate 1 and the bottom supporting member 5. The distance d satisfies the relationship; $d>G$ with the gap G which is formed between the first lead electrode 11 (or the second lead electrodes 64 and 74) and the external connecting terminals 13, 14 and 15.

The solder 20 fills the space formed by the gap G over the distance d and connects the first lead electrode 11 (or the second lead electrodes 64 and 74) and the external connecting terminals 13, 14 and 15. With this structure, the solder 20 does not remelt to become absorbed into the paste solder applied to the printed board when the electronic component is mounted thereon.

Therefore, no defective connection between the first lead electrode 11 (or the second lead electrodes 64 and 74) and the external connecting terminals 13, 14 and 15 will occur.

Also, since the relationship of the distance d with the gap G is expressed as: $d>G$, solder bridging does not occur. Consequently, there is no solder bridging to remelt when the electronic component is subject to a high temperature such as in reflow soldering. Thus, no disconnection of the bridging due to the surface tension of the solder will occur. The distance d should be set at a value of 10 times the gap G or less.

As the bottom supporting member 5 has external connecting terminals 13, 14 and 15, the electronic component can be mounted on the printed board by soldering the external connecting terminals 13, 14 and 15. Because of this, it is possible to mount the piezoelectric substrate 1 via the bottom supporting member 4 even if the piezoelectric substrate 1 cannot be mounted directly on the circuit board. The piezoelectric substrate 1 is not likely to be subjected to the effect of soldering heat and no degradation of the characteristics of the piezoelectric substrate 1 due to adhered solder is likely to occur.

Since the front supporting member 4 and bottom supporting member 5 are bonded to the surfaces of the first resin layer 2, and the second resin layer 3 respectively, the mechanical strength of the piezoelectric component is increased. Because of this, chipping and other damage caused to the piezoelectric component during transportation and while mounting can be prevented. Also, the piezoelectric substrate is less likely to lose adhesion to the resin layer even in the case of a thermal shock or the like from the outside.

In the example implementation, the piezoelectric substrate 1 includes resonators 6 and 7 wherein front electrodes 61 and 71 and bottom electrodes 62 and 63, and 72 and 73 are arranged in such a way that they face each other on the front and bottom sides of the piezoelectric substrate. The first resin layer 2 and the second resin layer 3 have hollow sections 211 and 212, and 311 and 312, so that one set of these hollow regions is placed over the front side of the piezoelectric substrate 1 and the other set is placed over the bottom side of the piezoelectric substrate 1 in such a way that the hollow sections 211 and 212, and 311 and 312 form a space for vibration around the resonators 6 and 7. The required vibration space is thereby securely created by the hollow sections 211 and 212, and 311 and 312.

Also, as the front electrodes 61 and 71 are in continuous contact with the first lead electrode 11, which is mounted on the bottom side via conductor 12 that runs between bottom and front of piezoelectric substrate 1 and also as the bottom electrodes 63 and 73 are in continuous contact with the second lead electrodes 64 and 74 that are located on the bottom side, it is possible to draw both the front electrodes 61 and 71 and the bottom electrodes 63 and 73 on the same side, namely, the bottom side. Because of this, the external lead path for resonators 6 and 7 can be short, with the advantages such as reduced lead inductance and the accompanying improvement in characteristics and so forth.

As the bottom supporting member 5 has the external connecting terminals 13, 14 and 15 on the outside, and as the external connecting terminals 13, 14 and 15 are in continuous contact with the first lead electrode 11 and the second lead electrodes 64 and 74, the external connecting terminals 13, 14 and 15 that are positioned on the bottom supporting member 5 function as external connecting terminals. Because of this, problems such as solder leaching in the first lead electrode 11 and the second lead electrodes 64 and 74 that are inducted out from resonators 6 and 7 which are thin film elements, can be prevented. As the external connecting terminals 13, 14 and 15 on the bottom supporting member 5 can be formed as a thick film, the effect of solder leaching can be ignored.

As the front supporting member 4 and the bottom supporting member 5 are made of a ceramic material such as alumina, the coefficients of thermal expansion between the piezoelectric substrate 1 and the front supporting member 4, and between the piezoelectric substrate 1 and the bottom supporting member 5, are similar, thus reducing stress caused by thermal shock and the like, and eliminating degradation of piezoelectric characteristics. For example, when a typical value for the coefficient of thermal expansion for piezoelectric substrate 1 is $6\times10^{-6}/°$ C., and the front supporting member 4 and bottom supporting member 5 are composed of 96% alumina, the value is $7.5 \times 10^{-6}/°$ C. This reduces the difference between the coefficients of thermal expansion between the piezoelectric substrate 1 and the front supporting member 4 and between the piezoelectric substrate 1 and the bottom supporting member 5. Even when it is subject to changes of temperature in thermal shock tests, degradation of the piezoelectric characteristics is insignificant. For example, in a 500-cycle thermal shock test in which one cycle is 30 minutes at $-55°$ C. and 30 minutes at $125°$ C., little degradation of piezoelectric characteristics is observed.

INDUSTRIAL APPLICABILITY

As has been described above, the present invention has the following possibilities for industrial application:

(a) An electronic component can be provided in which a defective connection due to solder bridging and solder bridge disconnection are not likely to occur.

(b) An electronic component can be provided in which the filling solder does not remelt and thus precludes to become absorbed into the paste solder applied to the printed board when the electronic component is mounted thereon.

(c) An electronic component can be provided that may be directly mounted on a circuit board by soldering the external connecting terminals.

(d) An electronic component can be provided in which the electronic element is not likely to be subject to the effect of the soldering heat and in which it is possible to prevent degradation of the characteristics of the electronic elements caused by solder adhered to the element.

(e) An electronic component can be provided in which chipping and other damage caused during transportation and while mounting can be prevented and in which it is not likely that the electronic element will lose adhesion to the resin layer even when subjected to a thermal shock or the like from the outside.

We claim:

1. An electronic component comprising:

a piezoelectric element having a lead electrode at the edge; a supporting member being positioned at a location that faces said piezoelectric element across a gap G, and having an external connecting terminal at a location that faces said lead electrode;

a resin layer being positioned between said piezoelectric element and said supporting member, being indented by the distance d from the edge of said piezoelectric element and bonding said piezoelectric element to said supporting member, said distance d satisfying the relationship d>G with said gap G; and a solder filling the space formed by said gap G over said distance d and connecting said lead electrode and said external connecting terminal.

2. The electronic component according to claim 1, wherein:

said piezoelectric element includes a piezoelectric substrate and a plurality of resonators, said resonators each having a front electrode and two bottom electrodes that are positioned opposite each other on the front and bottom sides of said piezoelectric substrate; and said lead electrodes are located on the bottom side of said piezoelectric substrate and comprise a first lead electrode and a second lead electrode, each of which is inducted out to the edge of said piezoelectric substrate, said first lead electrode being continuously inducted to said front electrodes and said second lead electrode being continuously inducted to said bottom electrodes.

3. The electronic component according to claim 1, wherein said supporting member is made of a ceramic material.

4. The electronic component according to claim 3; wherein said supporting member includes a front supporting member and a bottom supporting member, said front supporting member being positioned on the front of said piezoelectric element and said bottom supporting member being positioned at the bottom of said piezoelectric element.

5. The electronic component according to claim 1, wherein said resin layer forms a cavity for vibration around the resonators of said piezoelectric electronic element.

6. The electronic component according to claim 5; wherein said resin layer includes a hollow layer and a sealing layer, said hollow layer comprising hollow regions with a plurality of openings at locations clear of said front electrode and said bottom electrode, and said sealing layer being adhered to said hollow layer so as to seal said openings.

7. The electronic component according to claim 5; wherein said resin layer comprises a first resin layer and a second resin layer, said first resin layer being situated between said front supporting member and said piezoelectric element, and said second resin layer being situated between said piezoelectric element and said bottom supporting member.

\* \* \* \* \*